(12) United States Patent
Kiehlbauch et al.

(10) Patent No.: US 8,853,050 B2
(45) Date of Patent: Oct. 7, 2014

(54) METHODS OF FORMING CAPACITORS

(75) Inventors: Mark Kiehlbauch, Boise, ID (US); Kevin R. Shea, Boise, ID (US)

(73) Assignee: Micron Technology, Boise, ID (US)

( * ) Notice: Subject to any disclaimer, the term of this patent is extended or adjusted under 35 U.S.C. 154(b) by 3 days.

(21) Appl. No.: 13/615,147

(22) Filed: Sep. 13, 2012

(65) Prior Publication Data

US 2013/0005111 A1    Jan. 3, 2013

Related U.S. Application Data

(63) Continuation of application No. 12/190,821, filed on Aug. 13, 2008, now Pat. No. 8,268,695.

(51) Int. Cl.
  *H01L 21/20* (2006.01)
  *H01L 27/108* (2006.01)
  *H01L 49/02* (2006.01)

(52) U.S. Cl.
  CPC .......... *H01L 28/90* (2013.01); *H01L 27/10852* (2013.01); *H01L 27/10814* (2013.01)
  USPC .................... 438/397; 438/399; 257/E21.648

(58) Field of Classification Search
  USPC ........................ 438/396–399, 700, 702, 759; 257/E21.395, E21.648
  See application file for complete search history.

(56) References Cited

U.S. PATENT DOCUMENTS

| | | | |
|---|---|---|---|
| 4,705,659 A | 11/1987 | Bernstein et al. | |
| 5,155,657 A | 10/1992 | Oehrlein et al. | |
| 6,294,425 B1 | 9/2001 | Hideki | |
| 6,599,794 B2 | 7/2003 | Kiyotoshi et al. | |
| 6,613,669 B2 | 9/2003 | Taguwa | |
| 7,326,587 B2 | 2/2008 | Park et al. | |
| 2003/0017669 A1 | 1/2003 | Kiyotoshi et al. | |
| 2003/0077891 A1 | 4/2003 | Drynan | |
| 2004/0011653 A1 | 1/2004 | Collins et al. | |
| 2005/0191856 A1 | 9/2005 | Torek et al. | |
| 2005/0287738 A1 | 12/2005 | Cho et al. | |
| 2006/0099768 A1 | 5/2006 | Yokoi | |
| 2007/0001208 A1 | 1/2007 | Graham et al. | |
| 2007/0134872 A1 | 6/2007 | Sandhu et al. | |
| 2008/0100779 A1* | 5/2008 | Choo et al. ..................... 349/96 |
| 2009/0176011 A1 | 7/2009 | Kiehlbauch | |
| 2009/0275185 A1 | 11/2009 | Shea et al. | |
| 2009/0275187 A1 | 11/2009 | Kiehlbauch et al. | |

FOREIGN PATENT DOCUMENTS

| | | |
|---|---|---|
| KR | 100656283 | 12/2006 |
| KR | 1020060134344 | 12/2006 |
| KR | 1020070110747 | 11/2007 |
| KR | 1020100004648 | 1/2010 |
| WO | WO 2008/040706 | 4/2008 |

OTHER PUBLICATIONS

EP US2009/050863, Oct. 25, 2012, EP Search Report.

(Continued)

*Primary Examiner* — Calvin Choi
(74) *Attorney, Agent, or Firm* — Wells St. John P.S.

(57) ABSTRACT

Some embodiments include methods of making stud-type capacitors utilizing carbon-containing support material. Openings may be formed through the carbon-containing support material to electrical nodes, and subsequently conductive material may be grown within the openings. The carbon-containing support material may then be removed, and the conductive material utilized as stud-type storage nodes of stud-type capacitors. The stud-type capacitors may be incorporated into DRAM, and the DRAM may be utilized in electronic systems.

23 Claims, 5 Drawing Sheets

(56) References Cited

OTHER PUBLICATIONS

WO US2009/050863 IPRP, Feb. 15, 2011, Internatl Prelim Rpt on Patent.
WO US2009/050863 Srch Rpt., Feb. 24, 2010, International Search Report.
WO US2009/050863 Written Opinion, Feb. 24, 2010, Written Opinion.
Applicant Response to Non-Final Office Action issued for U.S. Appl. No. 11/971,138. Response filed Aug. 7, 2011.
USPTO Non-Final Office Action issued for U.S. Appl. No. 11/971,138. Mail Date May 27, 2011.

* cited by examiner

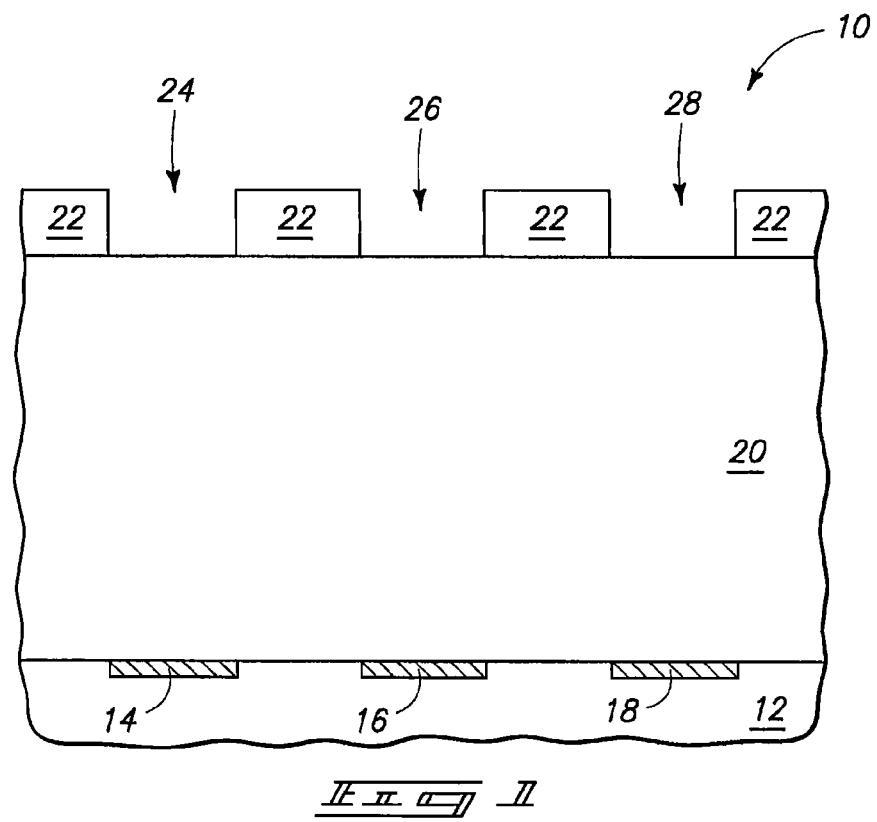
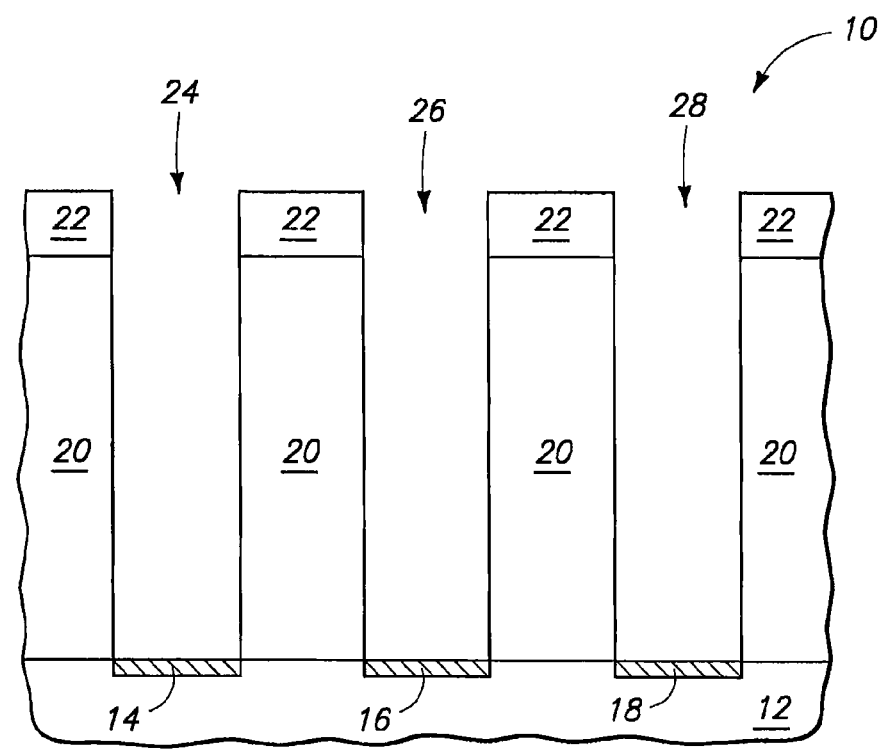

METHODS OF FORMING CAPACITORS

RELATED PATENT DATA

This patent resulted from a continuation of U.S. patent application Ser. No. 12/190,821, filed Aug. 13, 2008, and which is hereby incorporated by reference in its entirety into this application.

TECHNICAL FIELD

Methods of making capacitors, DRAM arrays and electronic systems.

BACKGROUND

Support materials may be formed over semiconductor material and utilized for fabrication of integrated circuit components.

A typical support material is silicon dioxide. The silicon dioxide may be undoped, or may be doped with one or more of phosphorus, boron and fluorine (for instance, the silicon dioxide may be in the form of borophosphosilicate glass).

One method of utilizing support material is to form capacitors for dynamic random access memory (DRAM). Openings may be formed in the support material, and then one or more structures may be fabricated by depositing material within the openings. For example, container-shaped capacitor storage nodes may be formed by depositing a layer of titanium nitride to partially fill openings in a support material. Subsequently, the support material may be removed, and then capacitor dielectric and capacitor plate material may be deposited within and around the storage nodes to form capacitor constructions.

Silicon dioxide may have several disadvantages as a support material. For instance, patterning of silicon dioxide may be complicated due to a dry etch of silicon dioxide having a large physical component (that is, it may be more like physical sputtering than like a chemical etch). The sputtering nature may create difficulty in obtaining a straight profile since the etch may exhibit a lateral component that can lead to a tapered profile.

It is desired to develop new methods of utilizing support materials for fabrication of microelectronic structures.

BRIEF DESCRIPTION OF THE DRAWINGS

FIGS. 1-6 are diagrammatic, cross-sectional views of a portion of a semiconductor construction at various process stages of an embodiment.

DETAILED DESCRIPTION OF THE ILLUSTRATED EMBODIMENTS

Figure 3:
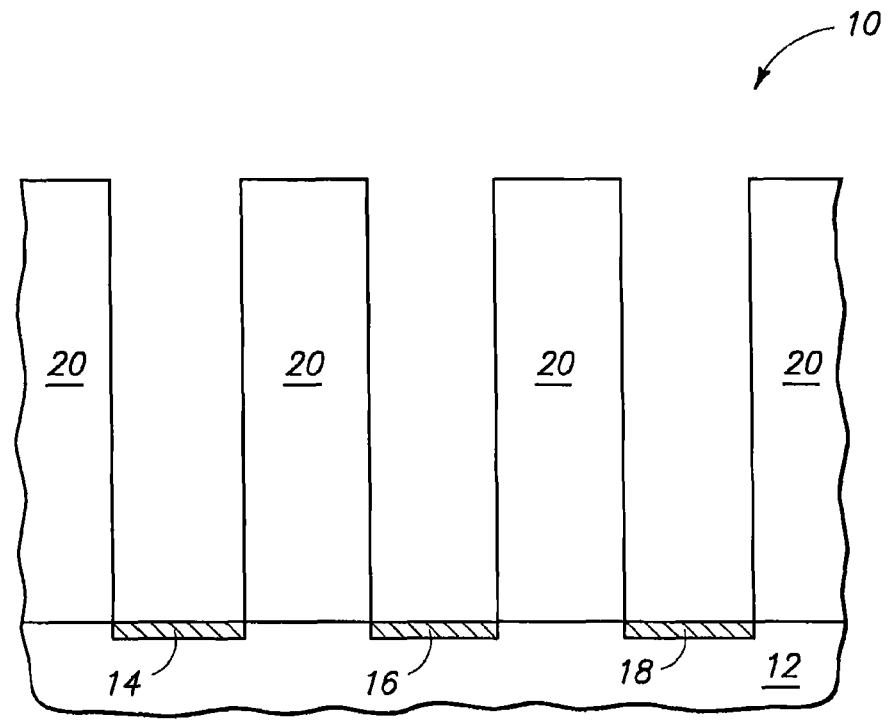

As the level of integration continues to increase in integrated circuitry, electronic components are formed to increasing the smaller dimensions. One type of component utilized in integrated circuitry is a capacitor. Capacitors may serve numerous roles, with a common role being utilization as charge storage devices of DRAM.

Capacitors are becoming increasingly tall and thin in an effort to reduce the footprint of individual capacitors, and thereby conserve semiconductor real estate. Current capacitor dimensions are approaching the limits attainable by conventional processing, and it is desired to develop new processing so that capacitors may be scaled to increasingly thinner dimensions.

In some embodiments, the invention described herein pertains to new processing for forming capacitors in which stud-type capacitors are patterned within a carbon-containing support material. The carbon-containing support material may provide advantages over silicon dioxide-containing support materials. For instance, it may be more practical to pattern properly aligned openings within carbon-containing support material than it would be to pattern such openings in silicon dioxide-containing material. In some embodiments, some prior art problems may be alleviated, or even prevented, by utilization of carbon-containing support material. Among the prior art problems that may be alleviated or prevented are problems known in the art as twisting, and problems associated with obtaining a straight profile along sidewalls of an etched opening.

Carbon-containing support materials have been described in U.S. patent application Ser. No. 11/971,138 for utilization in fabrication of container-type capacitors. There are some distinct differences between the fabrication of container-type capacitors and stud-type capacitors that may be taken advantage of when utilizing carbon-containing support materials, and some embodiments described herein pertain to utilization of such advantages. For instance, the storage node material of a stud-type capacitor may be grown from an electrical node exposed within an opening in a carbon-containing support material, rather than deposited over the support material. Thus, there can be no need to remove storage node material from over the support material, which can allow etching and/or planarization steps to be omitted. Avoidance of etching and/or planarization eliminates process steps, which can improve throughput of a fabrication process, reduce opportunities for errors in the process, and ultimately reduce costs associated with the process.

An example embodiment process for utilizing a carbon-containing support material during fabrication of stud-type capacitors is described with reference to FIGS. 1-6.

FIG. 1 shows a portion of a semiconductor construction 10. The semiconductor construction includes a substrate 12 supporting a plurality of electrical nodes 14, 16 and 18. Substrate 12 can comprise, consist essentially of, or consist of, for example, monocrystalline silicon lightly-doped with background p-type dopant. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The substrate may be homogeneous, or may comprise various layers and materials associated with integrated circuit fabrication.

Electrical nodes 14, 16 and 18 may comprise any suitable materials. For instance, the nodes may correspond to conductively-doped regions of a monocrystalline substrate. In such embodiments, the conductively-doped regions may be either n-type or p-type majority doped. In other embodiments, one or more of the nodes 14, 16 and 18 may comprise metal, and may correspond to a metal-containing pedestal supported by substrate 12. The metal may be in any suitable form; and may, for example, comprise one or more of elemental metal (for instance, titanium, tungsten, platinum, etc.), metal nitride (for instance, titanium nitride), and metal silicide (for instance, titanium silicide). In some embodiments, the electrical nodes 14, 16 and 18 may correspond to polysilicon contacts between other semiconductor devices (not shown). For instance, the nodes 14, 16 and 18 may be the tops of polysilicon pillars, and at least some of such polysilicon pillars may be spaced from one another by digit lines (not shown).

A support material 20 is over substrate 12, and is over the electrical nodes 14, 16 and 18. The support material may be a carbon-containing material. Support material 20 can comprise a single homogeneous layer (as shown), multiple layers of a single homogeneous material, or multiple layers of differing composition and/or physical properties. Support material 20 can comprise, consist essentially of, or consist of one or more electrically insulative and/or electrically conductive materials. In particular, support material 20 may contain at least 20 atomic percent (at %) carbon. While 20 at % carbon may be suitable for either insulative or conductive materials, a higher carbon content might contribute to increased conductivity, depending upon the specific material. Consequently, in the case of electrically conductive materials, support material 20 may contain at least 25 at % carbon. Especially in the case of electrically conductive materials, support material 20 may contain at least 50 at % carbon.

The carbon may be primarily in the form of an electrically conductive carbon backbone polymer, or a hydrocarbon-containing silicate backbone polymer. Although the silicate backbone polymer may be either electrically conductive or electrically insulative, generally such polymers are electrically insulative. Silicate backbone polymers are known containing as much as 36 at % carbon, but which are insulative.

In the case where support material 20 is electrically conductive, feature charging may be reduced. As a result, vertical and/or lateral potential gradients may be reduced, addressing the problems of aspect ratio dependent etch and twisting. Reduction of feature charging thus may become especially significant for high aspect ratio features. In the case where support material 20 is electrically insulative, even though feature charging is not necessarily reduced, such support materials may provide other benefits described herein.

Support material 20 may further include titanium and/or silicon. The silicon may be primarily in the form of the hydrocarbon-containing silicate backbone polymer. Alternatively, the silicon may be in another form. The titanium and/or silicon may be in the form of oxides, which are insulative, or in other forms, which may be insulative or conductive. Titanium and/or silicon may be provided to increase the rigidity of support material 20 beyond the rigidity otherwise exhibited in the absence of titanium and silicon. A more rigid support material 20 may improve stability during subsequent processing. An amount of titanium and/or silicon may be selected to produce the desired effect.

In the case where support material 20 does not include titanium, the silicon might not exceed 26 at %. In the case where support material 20 does not include silicon, the titanium might not exceed 12 at %. In the case where support material 20 includes both titanium and silicon, the titanium might not exceed 7.7 at % and silicon might not exceed 12.5 at %.

Support material 20 may be non-crystalline. For example, support material 20 may consist of amorphous carbon, intermediate carbon, transparent carbon, or a combination thereof. In the context of the present document, "amorphous" carbon refers to carbon that is not crystalline. That is, amorphous carbon includes "transparent" carbon which has some structural regularity due to an increased prevalence of sp3 hybridized bonding (four single bonds per carbon). However, transparent carbon does not exhibit the high degree of structural regularity well known as characteristic of crystalline carbon (for example, diamond, graphite, etc.). In comparison, fully amorphous carbon has no structural regularity due to an increased prevalence of sp2 hybridized bonding (one double bond and two single bonds per carbon) and literally "lacks definite form," i.e. is amorphous. Fully amorphous carbon thus includes more aromatic and/or unsaturated hydrocarbons. Understandably, amorphous carbon also includes "intermediate" carbon positioned between fully amorphous carbon and crystalline carbon with regard to its structural regularity. Transparent carbon is thus within the realm of, and is one type of, intermediate carbon.

One example of transparent carbon contains about 55 at % carbon and about 40 at % hydrogen, with the remainder being nitrogen and/or oxygen. One example of fully amorphous carbon includes about 70 at % carbon and about 25 at % hydrogen, with the remainder being nitrogen and/or oxygen. Consequently, support material 20 may consist of from about 55 to about 70 at % carbon, about 5 at % or less of nitrogen, oxygen, sulfur, metals, and semimetals (any of which may be absent), and the remainder hydrogen. "Semimetals" commonly refers at least to boron, silicon, arsenic, selenium, and tellurium.

Forming support material 20 may include applying a liquid mixture to substrate 12, and then curing the liquid mixture into a solid. Application of the liquid mixture may be accomplished by known spin-on techniques. Forming support material 20 might be accomplished using other techniques, such as, for example, chemical vapor deposition (CVD), etc. Known CVD techniques for depositing transparent carbon include plasma-enhanced CVD and thermal CVD. Plasma-enhanced CVD of transparent carbon often occurs at about 375° C.

The liquid mixture may be a mixture of polymer solids and a carrier, and, optionally, a cross-linking agent and/or a catalyst. Potentially suitable liquid mixtures include anti-reflective coating (ARC) material mixtures and/or hard mask (HM) material mixtures. Liquid mixtures known for use in forming anti-reflective coatings and/or hard masks may be processed largely according to a manufacturer's specifications, including a series of heated baking and/or curing stages. Such processing may evaporate the carrier and other components while cross-linking and/or catalytically reacting (e.g., polymerizing) the polymer solids, leaving behind a support material in keeping with the embodiments herein.

Alteration of known liquid mixtures and/or the manufacturer's recommended processing may be useful to most effectively obtain a desired support material. In addition to composition of the liquid mixture, consideration may be given to selection of cure temperature and cure time as potentially affecting composition of resulting support materials. For example, curing conditions may influence the type of bonding and/or cross-linking in the support material. Also, for spin-on application, consideration may be given to selection of viscosity, spin speed (revolutions per minute), and dispense volume as affecting thickness of resulting support materials.

Examples of hard mask material mixtures include BSI.M05068B and BSI.S07051 of a proprietary composition available from Brewer Science, Inc. of Rolla, Mo. The former produces an organo-silicate hard mask material containing about 36 at % carbon while the latter produces an organo-titanate-silicate hard mask material containing about 22 at % carbon, with both being insulative. Examples of an ARC material mixture include BSI.M06089A of a proprietary composition also available from Brewer Science, Inc. The mixture produces an organic (no titanium or silicon) ARC material containing about 44 at % carbon, with the coating being conductive. Examples of known classes of conductive polymers include poly(acetylene)s, poly(pyrrole)s, poly (thiophene)s, poly(aniline)s, poly(fluorene)s, poly(3-alkylthiophene)s, polytetrathiafulvalenes, polynaphthalenes, poly (p-phenylene sulfide), and poly(para-phenylene vinylene)s.

Support material 20 can have a thickness over substrate 12 of, for example, greater than about 1 micrometer (µm). In some embodiments, the thickness might be less than about 3 µm, or from about 1.5 µm to about 2 µm.

A patterned masking material 22 is over support material 20. The patterned masking material may comprise any suitable composition or combination of compositions. The patterned masking material may, for example, comprise, consist essentially of, or consist of a hard mask (for instance, one or more of polysilicon, silicon dioxide and silicon nitride). The patterned masking material has a plurality of openings 24, 26 and 28 extending therethrough. The masking material 22 may be patterned by forming a photolithographically photoresist mask (not shown) over material 22, transferring a pattern from the photoresist mask to material 22 with an appropriate etch, and then removing the photoresist mask to leave the masking material 22 in the pattern shown in FIG. 1.

Referring to FIG. 2, openings 24, 26 and 28 are extended through support material 20 with an appropriate etch. The openings can have a high aspect ratio, and in some embodiments may have an aspect a ratio of at least about 20:1, at least about 30:1, or at least about 40:1. The openings can have an elevation of from about 1 µm to about 3 µm, and a width of about 60 nanometers (nm) or less. The openings may have any suitable outer peripheral shapes, and may have circular or elliptical outer peripheral shapes in some embodiments. The openings are ultimately used to form stud-shaped storage nodes of stud-type capacitor structures, as discussed in more detail below.

The openings may be formed over a memory array region of substrate 12, and may be utilized to form a capacitors of a DRAM array, as discussed in more detail below.

The etching of openings in support material 20 may comprise any of a variety of techniques, including anisotropically etching support material 20. Such etching may use a plasma generated from a gas composition containing $O_2$ along with $SO_2$, $SiCl_4$, $N_2$, or $N_2/C_xH_yF_z$, where x, y, and z are integers, $0 \leq x \leq 6$, $0 \leq y \leq 4$, and $0 \leq z \leq 8$. Examples of $C_xH_yF_z$ include $CH_2F_2$, $C_4F_6$, $C_4F_6$, $C_6F_6$ (aromatic), $C_5F_8$, etc. One set of possible anisotropic etching conditions includes supplying $O_2$ and $SO_2$ to an inductively coupled plasma reactor at a total flow rate of from about 50 standard cubic centimeters per minute (sccm) to about 300 sccm, and a flow rate ratio of $O_2$ to $SO_2$ of from about 1:2 to about 2:1. Another set of possible anisotropic etching conditions includes supplying $O_2$ and $SiCl_4$ to an inductively coupled plasma reactor at a total flow rate of from about 500 seem to about 300 sccm, and a flow rate ratio of $O_2$ to $SiCl_4$ of about 5:1. In either set, reactor temperature may be from about 20° C. to about 100° C. and, in some embodiments, may be from about 50° C. to about 70° C. Reactor pressure may be from about 5 milliTorr to about 100 milliTorr, and, in some embodiments, may be from about 20 milliTorr to about 40 milliTorr. Power supplied to the top plate may be from about 500 watts (W) to about 1200 W, and in some embodiments may be approximately 850 W. Reactor bias may be from about 20 volts to about 200 volts, and, in some embodiments, may be approximately 110 volts. One example of an inductively coupled plasma reactor includes a Lam 2300 Kiyo system available from Lam Research Corporation in Fremont, Calif.

A further set of possible anisotropic etching conditions includes supplying $O_2$ and $N_2$ to a capacitively coupled plasma reactor at a total flow rate of from about 100 seem to about 500 sccm, and a flow rate ratio of $O_2$ to $N_2$ of from about 1:2 to about 2:1. A still further set of possible anisotropic etching conditions includes adding $CH_xF_y$, where x and y are integers from 0 to 4 and the sum of x and y equals 4, to the $O_2/N_2$ gas mixture to provide 10% to 50% of the total flow. In either set, reactor temperature may be from about 20° C. to about 100° C., and in some embodiments may be from about 50° C. to about 70° C. Reactor pressure may be from about 5 milliTorr to about 100 milliTorr, and, in some embodiments, may be from about 20 milliTorr to about 40 milliTorr. The reactor may operate at dual frequency power with a high frequency power of from about 200 W to about 1000 W supplied at from about 27 megaHertz (MHz) to about 160 MHz, and a low frequency power of from about 20 W to about 1000 W supplied at from about 2 MHz to about 13.6 MHz. One example of a capacitively coupled plasma reactor includes a Lam 2300 Exelan system available from Lam Research Corporation in Fremont, Calif.

The properties of support material 20 discussed above, especially with carbon primarily in the form of an electrically conductive carbon backbone polymer, may enable formation of good quality openings to much higher aspect ratios than are achievable in silicon dioxide. The chemical component, as opposed to sputtering component, in anisotropic etching of support material 20 is larger than that of silicon dioxide. Such difference is even more dramatic for carbon backbone polymers. Support material 20 may thus be more effectively anisotropically etched to faun high aspect ratio openings than can convention silicon dioxide support materials.

The openings 24, 26 and 28 extend through support material 20 to upper surfaces of nodes 14, 16 and 18. If the nodes correspond to conductively-doped diffusion regions, then such upper surfaces will comprise semiconductor material (for instance, silicon and/or germanium). If the nodes correspond to metal-containing materials, then the upper surfaces of such nodes will comprise metal.

Referring to FIG. 3, masking material 22 (FIG. 2) is shown removed in the illustrated example embodiment. Such removal may be accomplished with an etch selective for the masking material relative to the underlying support material 20. In other embodiments, the masking material may be left over support material 20, and may then be removed at a subsequent processing stage.

Figure 4:
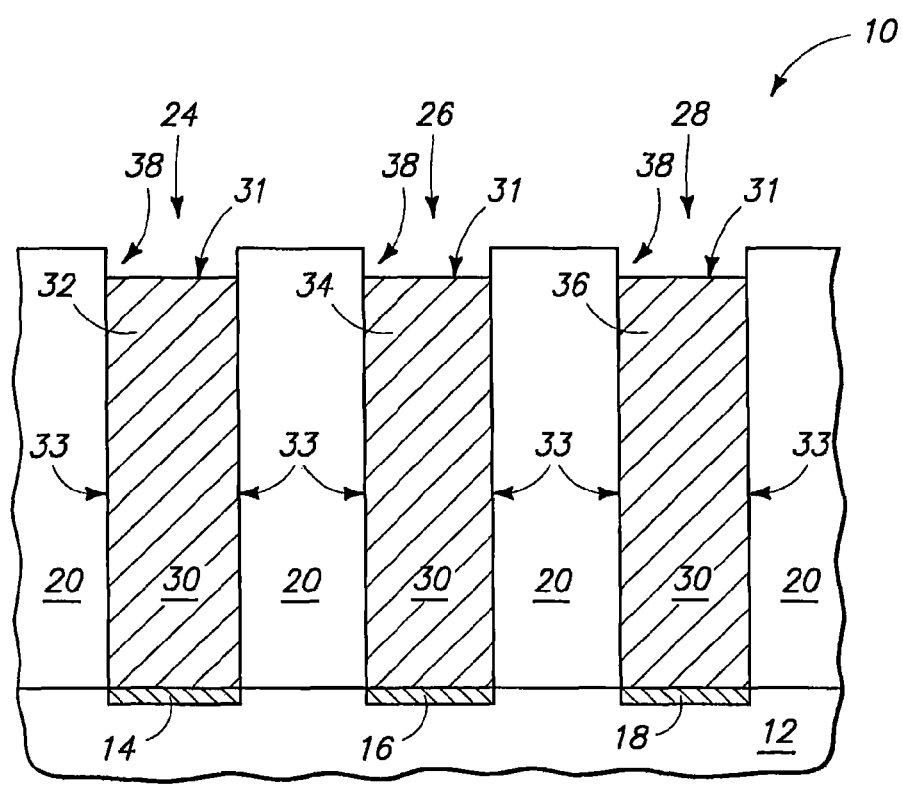

Referring to FIG. 4, electrically conductive material 30 is grown within openings 24, 26 and 28 to form pedestals 32, 34 and 36. Material 30 may comprise any suitable composition or combination of compositions. In some embodiments, material 30 comprises metal grown over metal-containing surfaces of nodes 14, 16 and 18. Such growth may comprise electrolytic plating and/or electroless processes. If electroless processes are utilized, upper surfaces of nodes 14, 16 and 18 may be treated with activating compositions if the upper surfaces are not otherwise suitable for electroless processes, and/or seed material may be formed over upper surfaces of nodes 14, 16 and 18 by a suitable deposition process (for example, physical vapor deposition). The electroless and/or electrolytic plating processes may comprise conventional operating conditions and may utilize conventional materials (for instance, material 30 may comprise one or more of ruthenium, titanium, platinum, nickel, cobalt and titanium nitride in applications in which one or both of electroless plating and electrolytic plating is utilized to form the material 30). The electroless and/or electrolytic plating processes may be conducted at relatively low temperatures, such as, for example, temperatures below about 200° C. Such low temperatures may be advantageous for some of the carbon-containing materials 20 that would break down at higher operating temperatures.

Another method that may be utilized for growing material 30 within openings 24, 26 and 28 is epitaxial growth in embodiments in which nodes 14, 16 and 18 comprise semiconductor-containing upper surfaces. The epitaxial growth may be utilized to form semiconductor material (for instance, silicon and/or germanium) which is either conductively-doped in situ during the epitaxial growth, or is conductively-doped by implanting after the epitaxial growth. The epitaxial growth may comprise conventional operating conditions, and may utilize conventional materials. The epitaxial growth may be conducted at relatively high temperatures (for instance, temperatures between about 200° C. and about 1000° C.) if the carbon-containing material is chosen to be stable at such temperatures. Among the carbon-containing materials that can be stable to relatively high temperatures are materials containing silicon and/or silicate incorporated therein.

Material 30 is shown to only partially fill openings 24, 26 and 28, and accordingly to leave unfilled regions 38 of the openings over the material 30. It can be advantageous that material 30 not overfill the openings in that such can eliminate a step of removing excess material 30 that would otherwise be deposited over support material 20 (for instance, a dry etch or a chemical-mechanical polishing step would be an extra removal step that may be utilized if excess material 30 were formed over support material 20). In order to ensure that overfilling of the openings is avoided, it may be desirable to underfill the openings. In other embodiments, the openings may be completely filled. Also, although it may be desired to not form material 30 over support material 20, there are also embodiments in which material 30 may be readily removed from over material 20, and accordingly, in which overfill of the openings is not problematic.

In the shown embodiment, material 30 grows only within openings 24, 26, and 28. In other words, growth of material 30 is initiated only over nodes 14, 16 and 18; and material 30 does not grow from exposed surfaces of support material 20.

The pedestals 32, 34 and 36 have uppermost (i.e., top) surfaces 31, and sidewall surfaces 33. The sidewall surfaces are against material 20. Ultimately, pedestals 32, 34 and 36 are utilized as storage nodes of stud-type capacitors, and accordingly it is desired to expose the sidewall surfaces for utilization in fabrication of the capacitors.

Figure 5:
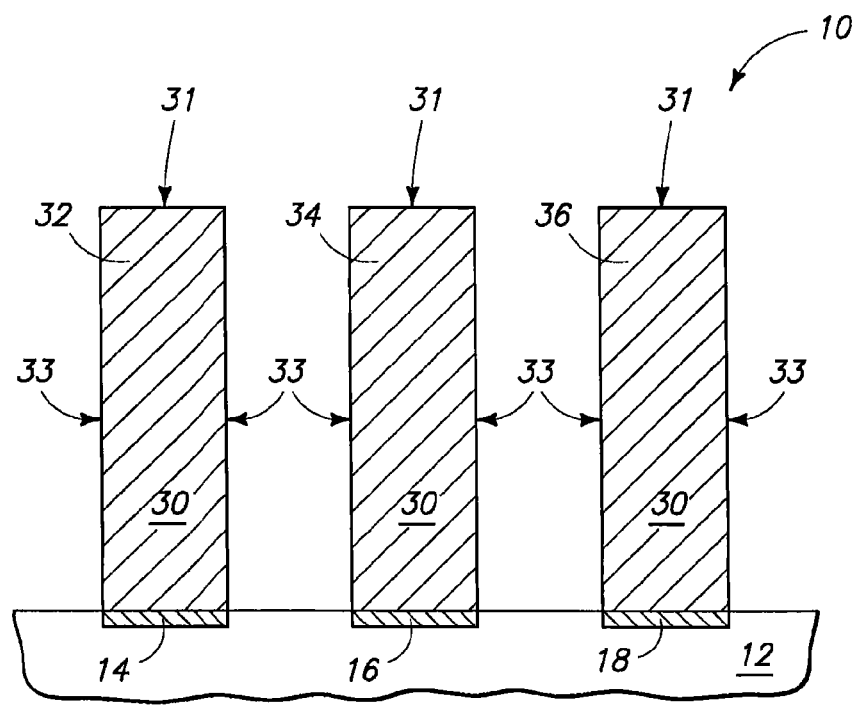

FIG. 5 shows construction 10 after support material 20 (FIG. 4) has been removed to exposed sidewall surfaces 33 of the pedestals 32, 34 and 36. Removal of support material 20 may be accomplished by dry stripping, among other possible dry or wet techniques, including a piranha etch. Dry stripping may include forming a plasma and exposing support material 20 to oxygen radicals generated by the plasma. Formation of the plasma may use a gas containing $O_2$ and one or both of $N_2/H_2$ and $NH_3$, where $NH_3$ and/or $N_2/H_2$ assists in reducing oxidation of metals exposed to the dry stripping. The $N_2/H_2$ may be "forming gas" comprising 10% $H_2$ and the remainder as $N_2$.

Known dry stripping systems exist and might be referred to as "microwave strippers." A perforated grate-like structure between the plasma and a substrate being dry stripped prevents plasma contact with and damage to the substrate, but allows oxygen radicals through the grate to isotropically etch. Known dry stripping systems are available from Mattson Technology, Inc. in Fremont, Calif. and Axcelis Technologies in Beverly, Mass. Often, dry stripping systems are used as a simple, effective technique to remove carbon-containing polymers, such as photoresist and unwanted processing residues, to clean substrates prior to subsequent processing. Support material 20 may be similar to such photoresist or residues in that they all contain carbon, but different in that support material 20 may exhibit a much greater thickness when used for forming high aspect ratio structures. Appropriate modification of processing times or other parameters may adapt known dry stripping processes to be suitable for removing of support material 20.

While using titanium and/or silicon in support material 20 may add rigidity, such additives might make support material 20 less susceptible to dry stripping. Titanium and/or silicon present as oxides might make support material even less susceptible to dry stripping. Despite such potential drawback, use of titanium and/or silicon may nevertheless be desirable for some applications given the structural properties and anisotropic etching properties. Similarly, use of silicate backbone polymers may decrease susceptibility to dry stripping compared to use of carbon backbone polymers.

Although an entirety of support material 20 (FIG. 4) is removed in the shown embodiment, in other embodiments only some of the support material may be removed so that only portions of sidewalls 33 are exposed.

Figure 6:
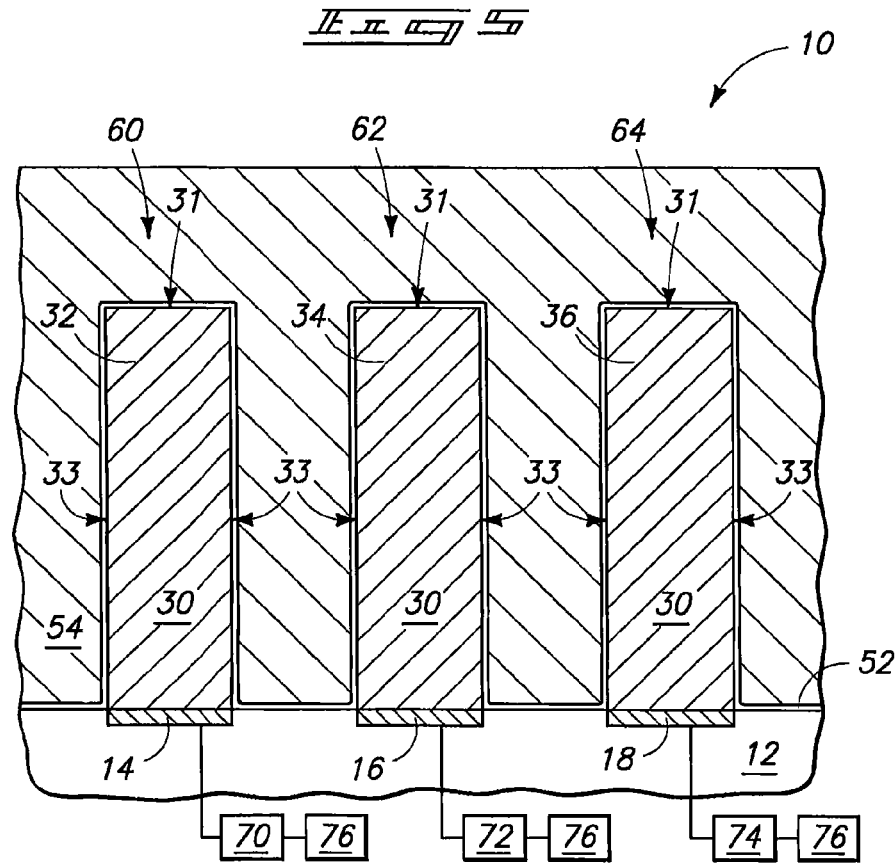

Referring to FIG. 6, dielectric material 52 and capacitor plate material 54 are formed over and around pedestals 32, 34 and 36. The pedestals 32, 34 and 36 may be considered first capacitor electrodes, and the capacitor plate material 34 may be considered a second capacitor electrode which is capacitively coupled to the first capacitor electrode. Accordingly, the pedestals 32, 34 and 36 are incorporated into capacitors 60, 62 and 64, respectively. The illustrated capacitors are stud-type capacitors, and may be part of a large array of stud-type capacitors simultaneously formed over substrate 12. The capacitors may be incorporated into DRAM by utilizing transistor gates 70, 72 and 74 associated with wordlines to couple the capacitors to a bitline 76. The capacitors are illustrated being coupled to a common bitline, as would be the case if the capacitors are all in a common row of a memory array. Alternatively, the capacitors may be coupled to a common wordline if the capacitors are all in a common column of a memory array. The memory array would comprise numerous wordlines and bitlines utilized to uniquely address individual memory cells of the memory array. The transistor gates and bitlines are schematically illustrated in FIG. 6, and may comprise any suitable structures formed utilizing any suitable methodology. Accordingly, the transistor gates and bitlines may comprise conventional structures formed utilizing conventional methods.

Although the pedestals 32, 34 and 36 are shown to be free-standing in FIG. 5, in some embodiments a lattice of supporting material (not shown) may be utilized to provide additional support to the pedestals if tipping, toppling or stiction between adjacent pedestals is otherwise problematic.

The DRAM array of FIG. 6 may be incorporated into various electronic systems. Some example electronic systems are described below with reference to FIGS. 7-10.

Figure 7:
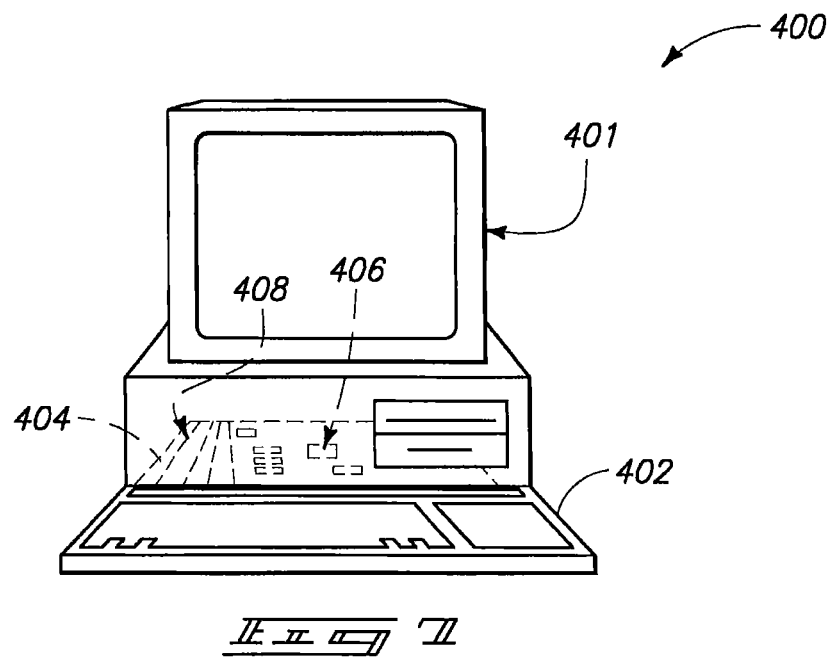
FIG. 7 is a diagrammatic view of a computer embodiment.
Figure 8:
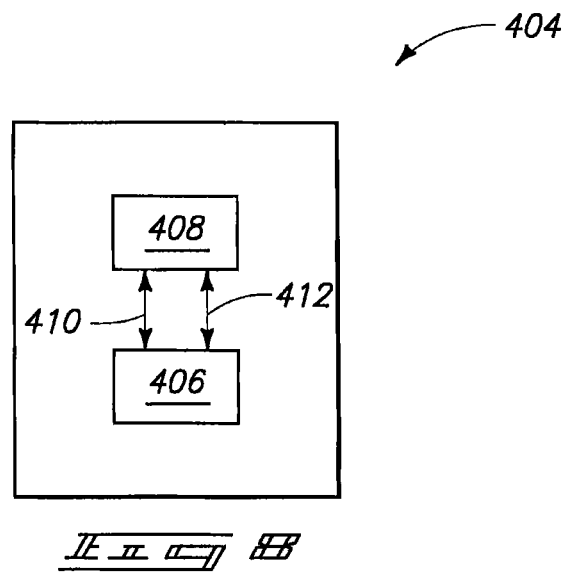
FIG. 8 is a block diagram showing particular features of the motherboard of the FIG. 7 computer embodiment.

FIG. 7 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 8. In such block diagram, the addressing circuitry is illustrated as 410 and the read circuitry is illustrated as 412.

Processor device 406 may correspond to a processor module, and associated memory utilized with the module may comprise structures shown in FIG. 6.

Memory device 408 may correspond to a memory module, and may comprise structures shown in FIG. 6.

Figure 9:
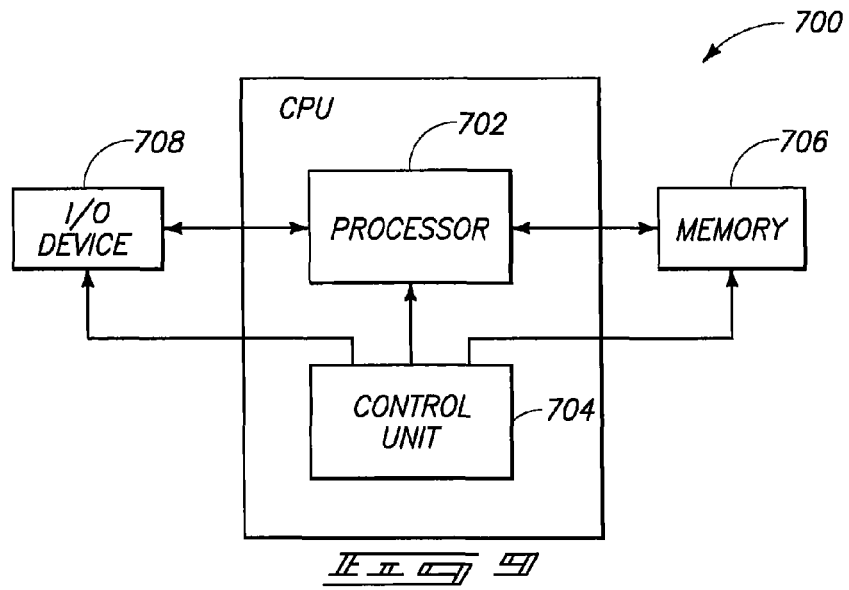
FIG. 9 is a high level block diagram of an electronic system embodiment.

FIG. 9 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include structures shown in FIG. 6.

Figure 10:
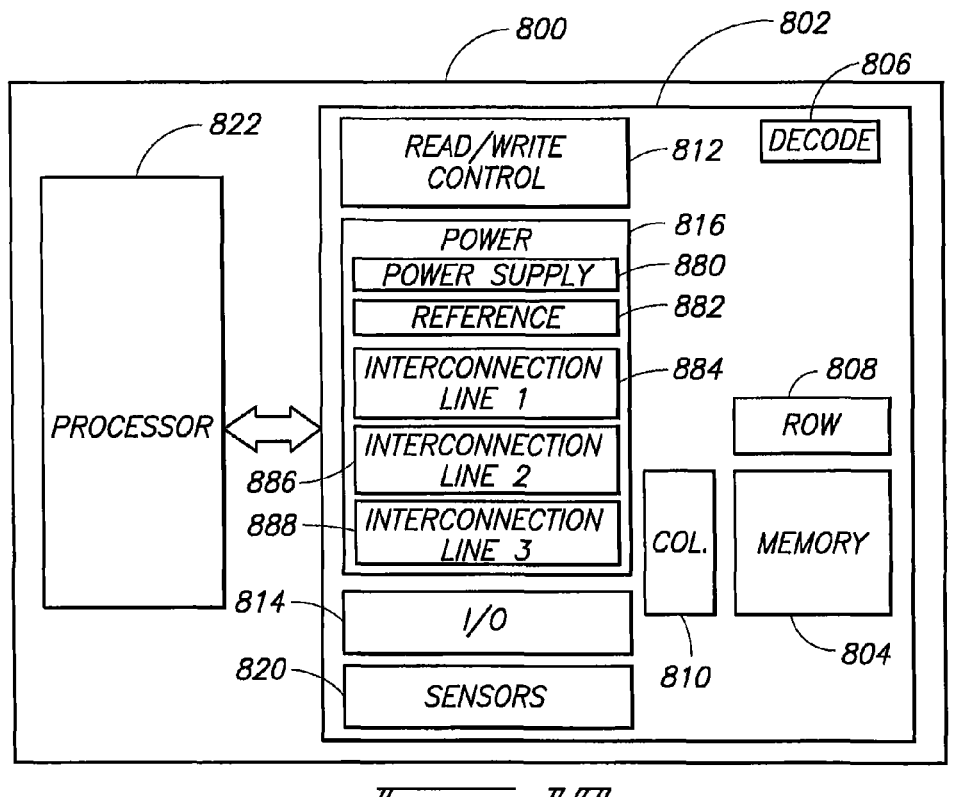
FIG. 10 is a simplified block diagram of a memory device embodiment.

FIG. 10 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first interconnection line with pulses, circuitry 886 for providing a second interconnection line with pulses, and circuitry 888 for providing a third interconnection line with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include structures shown in FIG. 6.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a capacitor, the method comprising:
   forming a support material over a substrate, the support material comprising at least 20 at % carbon, the support material comprises at least one of nitrogen, sulfur, metals and semimetals;
   forming an opening through the support material to the substrate;
   growing a first capacitor electrode in the opening;
   removing at least some of the support material to expose at least a portion of the first capacitor electrode;
   forming dielectric material over the exposed portion of the first capacitor electrode; and
   forming a second capacitor electrode over the dielectric material.

2. The method of claim 1 wherein the at least 20 at % carbon comprises at least 25 at % carbon.

3. The method of claim 1 wherein the at least 20 at % carbon comprises at least 50 at % carbon.

4. The method of claim 1 wherein the support material comprises multiple layers of a single homogeneous material.

5. The method of claim 1 wherein the support material is electrically insulative and wherein the at least 20 at % carbon comprises at least 36 at % carbon.

6. The method of claim 1 wherein an entirety of the support material comprises a single homogeneous layer.

7. The method of claim 1 wherein the support material is electrically conductive.

8. The method of claim 1 wherein the at least one of nitrogen, sulfur, metals and semimetals comprises any combination of three of the nitrogen, sulfur, metals and semimetals.

9. The method of claim 1 wherein the at least one of nitrogen, sulfur, metals and semimetals comprises all of the nitrogen, sulfur, metals and semimetals.

10. The method of claim 1 wherein the at least one of nitrogen, sulfur, metals and semimetals comprises any combination of two of the nitrogen, sulfur, metals and semimetals.

11. The method of claim 1 wherein the at least one of nitrogen, sulfur, metals and semimetals comprises only one of the nitrogen, sulfur, metals and semimetals.

12. The method of claim 1 wherein the semimetals comprises at least one of boron, silicon, arsenic, selenium and tellurium.

13. A method of forming a capacitor, the method comprising:
    forming a support material over a substrate, the support material comprising at least titanium and carbon;
    forming an opening through the support material to the substrate, the opening having an aspect ratio of 20:1 or greater;
    growing a first capacitor electrode in the opening, the first capacitor electrode comprising one or more metals;
    removing at least some of the support material to expose at least a portion of the first capacitor electrode;
    forming dielectric material over the exposed portion of the first capacitor electrode; and forming a second capacitor electrode over the dielectric material.

14. The method of claim 13 wherein the first capacitor electrode comprises one or more of titanium, nickel and titanium nitride.

15. The method of claim 13 wherein the growing comprises performing electroless plating.

16. The method of claim 13 wherein the forming of the support material comprising providing a liquid mixture and curing the liquid mixture, the liquid mixture comprising an anti-reflective coating material.

17. The method of claim 13 wherein the growing comprises performing electroless plating and electrolytic plating.

18. The method of claim 13 wherein the aspect ratio of 20:1 or greater comprises an aspect ratio of at least 40:1.

19. A method of forming a capacitor, the method comprising:
   forming a support material over a substrate, the support material comprising carbon and titanium;
   forming an opening through the support material to the substrate;
   growing a stud capacitor electrode in the opening;
   removing at least some of the support material to expose at least a portion of the first capacitor electrode;
   forming dielectric material over the exposed portion of the first capacitor electrode;
   forming a second capacitor electrode over the dielectric material; and
   wherein the titanium does not exceed 12 at %.

20. The method of claim 19 wherein the titanium does not exceed 7.7 at %.

21. The method of claim 19 wherein the support material further comprises silicon not to exceed 12.5 at % and the titanium does not exceed 7.7 at %.

22. A method of forming a capacitor, the method comprising:
   forming a support material over a substrate, the support material comprising at least 20 at % carbon;
   forming an opening through the support material to the substrate;
   growing a first capacitor electrode in the opening;
   removing at least some of the support material to expose at least a portion of the first capacitor electrode;
   forming dielectric material over the exposed portion of the first capacitor electrode;
   forming a second capacitor electrode over the dielectric material; and
   wherein the carbon in the support material does not exceed at least one of the following amounts: about 22 at % carbon, about 36 at % carbon, about 44 at % carbon, about 55 at % and about 70 at % carbon.

23. A method of forming a capacitor, the method comprising:
   forming a support material over a substrate, the support material comprising at least 20 at % carbon;
   forming an opening through the support material to the substrate;
   growing a first capacitor electrode in the opening;
   removing at least some of the support material to expose at least a portion of the first capacitor electrode;
   forming dielectric material over the exposed portion of the first capacitor electrode;
   forming a second capacitor electrode over the dielectric material; and
   wherein the carbon in the support material comprises a range of about 55 at % carbon to about 70 at % carbon.

* * * * *